(12) United States Patent
Bakker et al.

(10) Patent No.: US 6,987,275 B2
(45) Date of Patent: Jan. 17, 2006

(54) LITHOGRAPHIC APPARATUS AND DEVICE MANUFACTURING METHOD

(75) Inventors: Levinus Pieter Bakker, Helmond (NL); Jeroen Jonkers, Aachen (DE); Antonius Johannes Josephus Van Dijsseldonk, Hapert (NL); Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/396,693

(22) Filed: Mar. 26, 2003

(65) Prior Publication Data

US 2004/0013226 A1 Jan. 22, 2004

(30) Foreign Application Priority Data

Mar. 28, 2002 (EP) ............................................. 02252338

(51) Int. Cl.
*G03F 7/20* (2006.01)

(52) U.S. Cl. ............................. 250/492.2; 250/492.22; 355/30; 355/67; 355/77; 438/795

(58) Field of Classification Search .............. 250/492.2, 250/492.22; 355/30, 67, 77, 55, 773, 795; 438/795
See application file for complete search history.

(56) References Cited

U.S. PATENT DOCUMENTS

| 4,408,338 A | 10/1983 | Grobman |
| 4,866,517 A | 9/1989 | Mochizuki et al. |
| 2002/0090054 A1 | 7/2002 | Sogard |

FOREIGN PATENT DOCUMENTS

| EP | 1 211 918 A1 | 6/2002 |
| WO | WO 01/79936 | 10/2001 |

*Primary Examiner*—Jack I. Berman
(74) *Attorney, Agent, or Firm*—Pillsbury Winthrop Shaw Pittman LLP

(57) ABSTRACT

A controlled aperture provides an opening through a barrier separating two parts of the apparatus to enable a pulse of radiation to be radiated from one part of the apparatus to the a second part. The controlled aperture closes the opening between the pulses of radiation to minimize the gas flow between the first and second parts.

24 Claims, 6 Drawing Sheets

LITHOGRAPHIC APPARATUS AND DEVICE MANUFACTURING METHOD

RELATED APPLICATION

This application claims the benefit of priority to European Patent Application No. 02252338.5, filed Mar. 28, 2002, the contents of which are herein incorporated by reference.

BACKGROUND OF THE INVENTION

1. Field of the Invention

The present invention relates to a lithographic projection apparatus and a device manufacturing method.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

The performance of lithographic projection apparatus, especially those employing EUV radiation, has been limited by losses in intensity of the radiation beams. These losses result in an overall loss in intensity of the beam, resulting in increased exposure times and therefore reduced throughput, and local losses in intensity which results in a loss of the uniformity of the image projected onto the substrate. This effect is especially severe for apparatus using EUV radiation since the EUV radiation is significantly absorbed by most materials. Therefore it is desirable for the path of the beam to be in a vacuum to prevent such losses.

SUMMARY OF THE INVENTION

It is an aspect of the present invention to reduce the causes of beam intensity loss within a lithographic projection apparatus.

This and other aspects are achieved according to the invention in a lithographic apparatus including a radiation system constructed and arranged to provide a pulsed beam of radiation; a support structure constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; and a barrier constructed and arranged to prevent at least one of gas and particle flow from a first part to a second part of the apparatus, the barrier including a controlled aperture; and a controller that opens and closes the controlled aperture in synchronism with the pulsed beam so as to permit passage of pulses of the beam of radiation through the barrier.

This is advantageous if, for example, the gas present in the first part of the apparatus absorbs the radiation being used but the radiation is required to be transmitted through the second part of the apparatus. The gas flow between the first and second part of the apparatus is limited to only occur during the pulses of radiation thus significantly reducing the flow of gas. By reducing the gas flow to the second part of the apparatus less radiation will be absorbed. Such apparatus is also advantageous since any debris or other contaminants resulting from the pulse of radiation will typically arrive at the controlled aperture after it has closed due to the debris being slower than the photons of the radiation beam. Therefore the controlled aperture will also provide an effective barrier against debris.

The controlled aperture may include a stationary member, that may be integral with or connected to the barrier, provided with an opening aligned with the beam of radiation. The controlled aperture further may include a rotating member, located adjacent to the stationary member, provided with one or more openings that, as the rotating member rotates, are periodically aligned with the opening in the stationary member. This provides, periodically, an opening through the barrier which is closed at other times to prevent gas flow through the barrier. This configuration may be used at high cycle rates and may be adjusted for given situations by, for example, adjusting the speed of rotation of the rotating member and adjusting the sizes of the openings.

The controlled aperture may also include a second stationary member, arranged such that the rotating member is located between the first and second stationary members. The second stationary member is also provided with an opening aligned with the beam of radiation. The additional stationary member reduces the leakage of gas around the rotating member when the aperture is closed.

The controlled aperture may further have a second rotating member, also located between the two stationary members. The second rotating member also has one or more openings arranged such that, as the second rotating member rotates, the openings are periodically aligned with the openings in the stationary members. For the opening through the controlled aperture to be open, thus enabling a beam of radiation to be radiated through the barrier, an opening in both the first and the second rotating member must be aligned with the openings in the stationary members. This can improve the control of the controlled aperture. For example, the first and second rotating members may be configured such that they can rotate in opposite directions. In this case, the opening through the controlled aperture is partially open for a shorter proportion of the operation cycle. This in turn reduces the amount of gas that flows between the first and second parts of the apparatus.

Furthermore, a space may be provided between the first and second rotating members. This space may be filled with a buffer gas. The buffer gas further reduces the amount of gas that flows from the first part of the apparatus to the second part of the apparatus and is beneficial if the gas flow from the first to the second part of the apparatus is detrimental to the performance of the second part of the apparatus. The buffer gas is chosen to be less detrimental to the performance of the second part of the apparatus than the gas flowing from the first part of the apparatus. The buffer gas may be refreshed, either constantly or periodically.

The space between the rotating members, and hence the amount of buffer gas required, may be reduced by providing a tube that extends from an edge surrounding an opening on the first rotating member to an edge surrounding an opening on the second rotating member. This may be necessary if, for example, the buffer gas that is required is costly or if the required refresh rate of gas in the space is high.

In a further alternative embodiment, the space between the two rotating members may be filled with a further stationary member with an opening aligned with the beam of radiation. This will reduce the flow of gas around the rotating members when the aperture is closed. It further reduces the flow of gas to the second part of the apparatus because the buffer gas only enters when it is required.

In another alternative embodiment, the controlled aperture may include a stationary member, that may be integral with or connected to the barrier, provided with an opening aligned with the beam of radiation. The controlled aperture further comprises a rotating member, located adjacent to the stationary member, provided with one or more openings that, as the rotating member rotates, are periodically aligned with the opening in the stationary member. This provides, periodically, an opening through the barrier which is closed at other times to prevent gas flow through the barrier. A tube is provided, extending from an edge surrounding the opening in the stationary member. The tube defines a space that opens into the second part of the apparatus. The space contains a buffer gas, provided from a buffer gas inlet when an opening in the rotating member is aligned with the inlet. This embodiment may be synchronized with the pulsed beam but it also reduces the impact of gas flows into the second part of the apparatus by means of the buffer gas.

In another embodiment, the radiation system comprises a radiation source which is provided on a first side of the barrier and a substantially evacuated system provided on the other side of the barrier. This may be the case, for example, where the radiation source is an EUV discharge source requiring Xenon gas at a pressure of about 0.1 millibars and the EUV beam is required to be radiated through an evacuated system to reduce losses in beam intensity. The invention therefore provides an opening through the barrier for the EUV beam to be transmitted to the evacuated system while minimizing the flow of Xenon gas into the evacuated system.

Alternatively or additionally, the present invention may be used to separate the substrate from the projection system. In this case, it is advantageous to use the controlled aperture of the present invention since the pulses of radiation on the substrate will result in outgassing from the resist on the substrate. It is undesirable for the gasses, and any contaminants (such as hydrocarbons) entrained therein, to flow into the projection system where the gas will cause a reduction in the intensity of the radiation beam and the contaminants may cause damage to the elements of the projection system. The controlled aperture of the present invention significantly reduces the flow of gasses to the projection system.

According to a further aspect of the invention there is provided a device manufacturing method for use with a lithographic projection apparatus, the method including providing a substrate that is at least partially covered by a layer of radiation-sensitive material; providing a pulsed beam of radiation using a radiation system of the lithographic projection apparatus, the radiation system including a radiation source; using a patterning device to endow the beam with a pattern in its cross-section; projecting the patterned beam of radiation onto a target portion of the layer of radiation-sensitive material; opening and closing, in synchronism with the pulsed beam, a controlled aperture in a barrier for preventing gas flow from a first part to a second part of the lithographic projection apparatus, the controlled aperture providing an opening through the barrier aligned with one of the beams of radiation during pulses of the pulsed beam and substantially preventing gas flow from the first part to the second part of the lithographic projection apparatus between the pulses.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
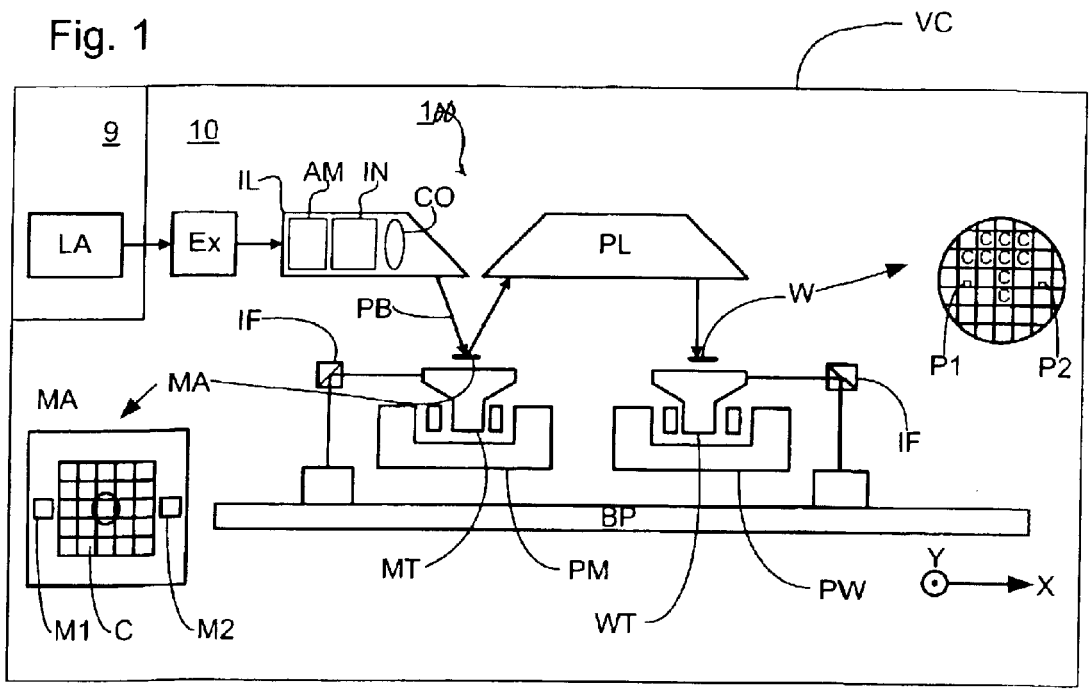
FIG. 1 depicts a lithographic projection apparatus according to an embodiment of the invention.

FIG. 1 schematically depicts a lithographic projection apparatus 100 according to an embodiment of the invention. The apparatus 100 includes a base plate BP; a radiation system Ex, IL constructed and arranged to supply a beam PB of radiation (e.g. EUV radiation), which in this particular case also comprises a radiation source LA; a first object (mask) table MT provided with a mask holder constructed and arranged to hold a mask MA (e.g. a reticle), and connected to a first positioning device PM that accurately positions the mask with respect to a projection system or lens PL; a second object (substrate) table WT provided with a substrate holder constructed and arranged to hold a substrate W (e.g. a resist-coated silicon wafer), and connected to a second positioning device PW that accurately positions the substrate with respect to the projection system PL. The projection system or lens PL (e.g. a mirror group) is constructed and arranged to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation beam which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beans PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:
1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

As shown in FIG. 1, the apparatus 100 is contained in a vacuum system VC. The source LA is located in a first evacuated compartment 9 and the remainder of the apparatus is located in a second evacuated compartment 10.

Figure 2:
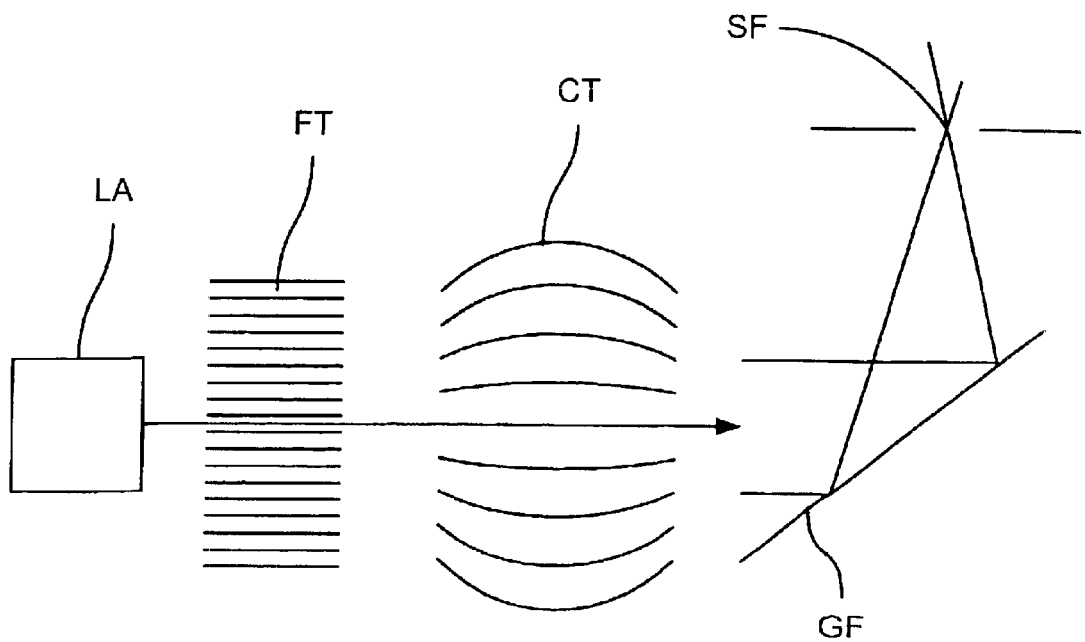
FIG. 2 depicts, in more detail, a portion of the apparatus shown in FIG. 1.

FIG. 2 represents, in more detail, a portion of the apparatus shown in FIG. 1. The source LA, which typically operates in an atmosphere of about 0.1 mbar of Xenon, produces radiation. The radiation passes through a foil trap FT which collects debris from the source LA and restricts the flow of gas from the source side to its other side which will typically be at approximately $10^{31\ 3}$ mbar. The radiation subsequently traverses a collector CT and is reflected by a grating spectral filter OF into the main body of the apparatus which is a vacuum system which will typically operate at $10^{31\ 6}$ mbar and contains, for example, the illumination system IL, the mask MA, the projection system PL and the substrate W. The controlled aperture of the present invention is therefore required to permit pulsed radiation to be transmitted between compartments of the apparatus which may operate at different pressures while minimizing the flow of gas between these compartments. Depending on the system requirements it can, for example, either replace or be in addition to the foil trap. In case of the latter, the controlled aperture may be located before or after the foil trap FT. A controlled aperture of the present invention may also be located after the grating spectral filter at a point of secondary focus SF.

Furthermore, the controlled aperture of the present invention may also be used between the projection system PL and the substrate W. As the resist on the substrate is selectively developed by the radiation system, a significant amount of gas is produced. The controlled aperture may therefore be used as part of a barrier to prevent or minimize the flow of gas from the substrate W to the projection system PL. This is beneficial as there may be particles and/or other debris entrained in the gas flow.

Infrared radiation in the beam causes wafer-heating. Consequently, it is desirable to minimize the amount of infrared radiation in the beam. Most of this infrared radiation is generated by hot elements in the lithographic apparatus and, in particular, in the source/collector module. The amount of infrared radiation produced by the hot elements is largely constant over time. Therefore the controlled aperture can be used to significantly reduce the infrared radiation since it will block it while the aperture is closed. A preferred position of the controlled aperture for this use is at the intermediate focus, where the beam diameter is relatively small. It may, however, be used at other locations to reduce the infrared radiation reaching the wafer. To improve the performance of the controlled aperture in minimizing transmission of the infrared radiation to the wafer, an infrared reflective coating may be applied to the infrared source side of the controlled aperture (reducing the heat-load on the controlled aperture) and/or a coating with low emissivity may be applied to the other side (reducing the infrared radiation from the controlled aperture). Furthermore, the controlled aperture may also be temperature controlled and/or may be cooled.

Wherever the controlled aperture is located it must allow the beam of radiation through without any significant loss in beam intensity but it must restrict the flow of gas through the aperture since the pressure will need to be kept lower on one side and since the gas on one side may interfere with components on the other side.

In general, the aperture will be timed to be open for each pulse of the source LA. However, the opening of the aperture may be delayed for one or more pulses of the source such that, although the opening of the barrier is still synchronized to the beam, it does not let every pulse through. This may be used, for example, during start-up of the source since the energy level of the initial pulses may be unstable. The source may need to be started-up regularly during the exposure of a wafer.

For the sake of simplicity, the description, below, of specific controlled apertures of the present invention will be in the context of separating the source LA from the remainder of the apparatus. It will, however, be appreciated that they may be utilized in any situation such as those discussed above.

Figure 3A:
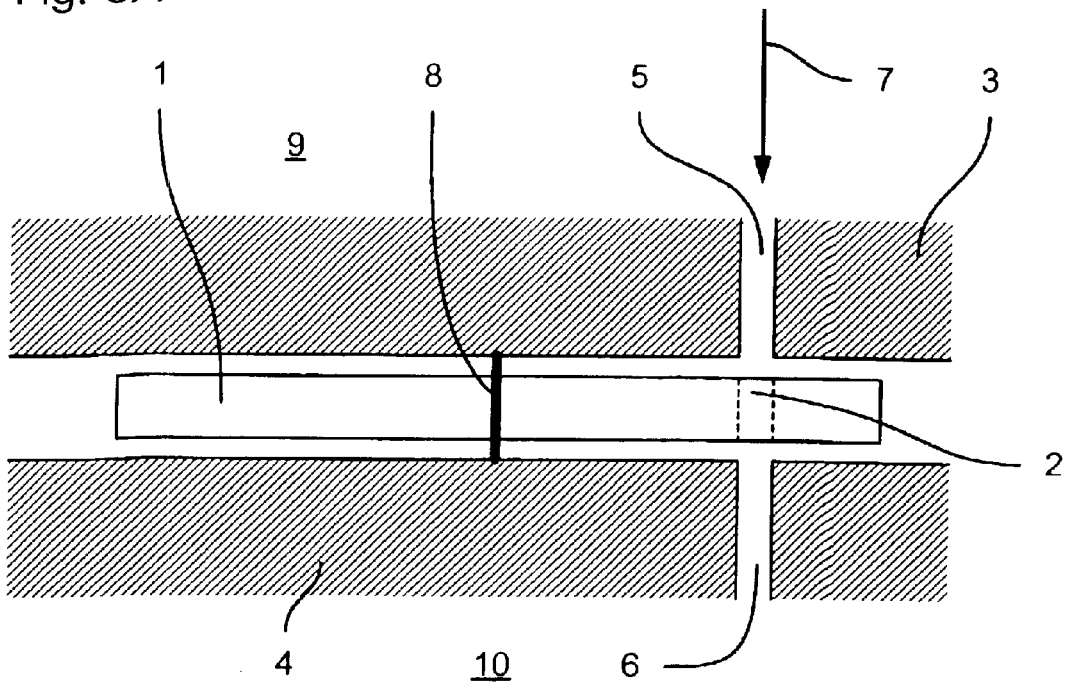
FIGS. 3A and 3B depict a controlled aperture of the present invention using a single rotating plate.

FIG. 3A depicts, in cross-section, a controlled aperture, taking the form of a "chopper," that may be used in the present invention. The chopper may be mounted onto or integrally formed in a barrier separating the first compartment 9 of the apparatus from the second compartment 10 of the apparatus. The chopper consists of a rotating plate 1 which rotates about an axis 8. The rotating plate 1 is located between two stationary plates 3, 4. The stationary plates 3, 4 may be connected to or integral to the barrier separating the two compartments 9, 10. The stationary plates 3, 4 have openings 5, 6, respectively, which are aligned with a beam of radiation 7. The rotating plate 1 has an opening 2. As the rotating plate 1 rotates, the opening 2 is periodically aligned with the openings 5, 6 in the stationary plates 3, 4. When the opening 2 in the rotating plate 1 is aligned with the openings 5, 6 in the stationary plates 3, 4 an opening is provided through the barrier from the first compartment 9 to the second compartment 10. At other times, when the opening 2 in the rotating plate 1 is not aligned with the openings 5, 6 in the stationary plates 3, 4, the rotating plate 1 forms a barrier between the opening 5 in the first stationary plate 3 and the opening 6 in the second stationary plate 4. Therefore no opening is provided in the barrier between the first compartment 9 to the second compartment 10.

When the apparatus is used, the beam of radiation 7 used is provided as a series of pulses of radiation, and the rotation of the plate 1 is timed such that the openings 2, 5, 6 are aligned during pulses of radiation. The beam of radiation 7 therefore may pass from the first compartment 9 to the second compartment 10. At other times the opening is closed, substantially preventing any flow of gas through the opening.

The rotating plate 1 shown in FIG. 3A has a single opening 2. However, the rotating plate(s) may be provided with a plurality of openings. This reduces the speed at which the rotating plate(s) must rotate since it will no longer need to complete a complete revolution between pulses of radiation.

Figure 3B:
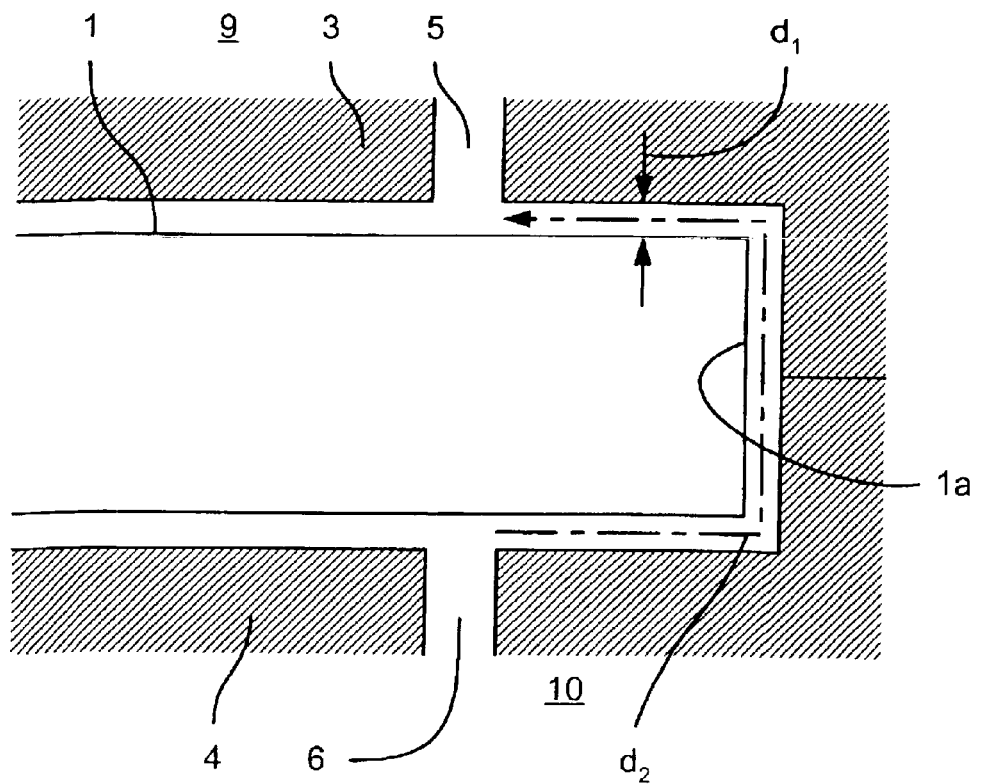

The effectiveness of the chopper shown in FIG. 3A for preventing the flow of gas between the first and second compartments 9, 10 is determined by how long the openings 2, 5, 6 are aligned or partially aligned and by how much gas flows around the rotating plate 1. FIG. 3B shows an enlarged view of part of the rotating plate 1 at an instant when the opening 2 in the rotating plate 1 is not aligned with the openings 5, 6 in the stationary plates 3, 4. The rate at which gas flows between the first and second compartments 9, 10 is dependent on the size of the gap $d_1$ between the rotating plate 1 and the stationary plates 3, 4 and the length of the flow path $d_2$ that the gas must flow around the rotating plate 1. Unwanted gas flow around the chopper will be reduced if the gap $d_1$ between the rotating plate and the stationary plates is minimized and if the length of the flow path $d_2$ around the rotating plate 1 is maximized. The latter may be effected by arranging the opening 2 in the rotating plate 1 as far as possible from the outside edge 1a of the rotating plate 1. Alignment of the openings 2, 5, 6 provides an easy gas flowpath between the first and second compartments 9, 10 but since the openings 2, 5, 6 are not aligned for much of the duty cycle of the chopper, the gas flow is greatly reduced in comparison to a constantly open passage.

Figure 4A:
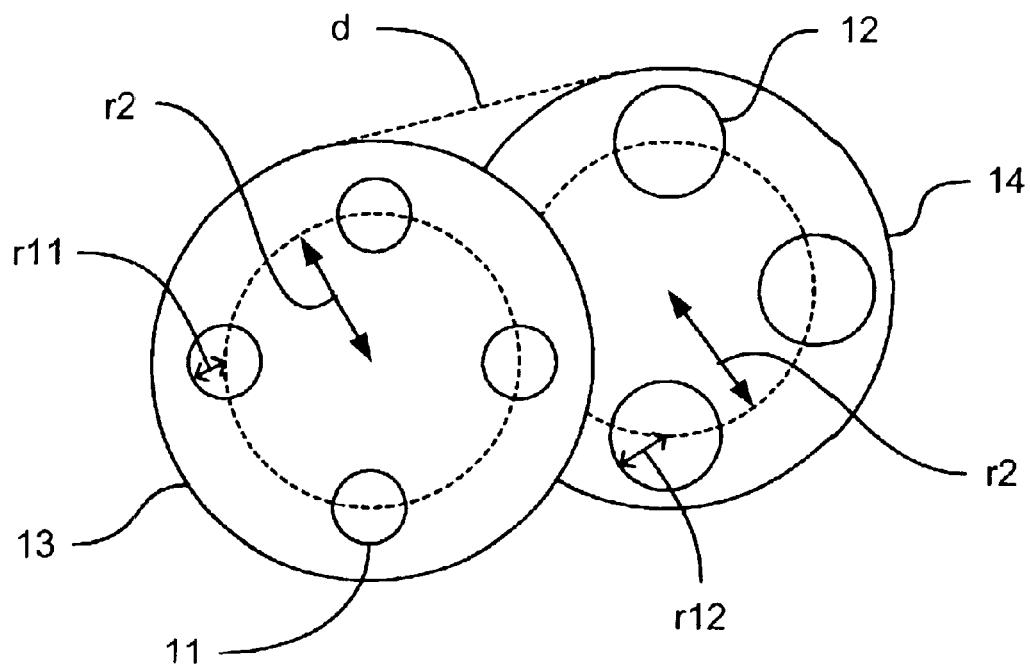
FIGS. 4A and 4B depict a controlled aperture of the present invention utilizing two rotating plates.
Figure 4B:
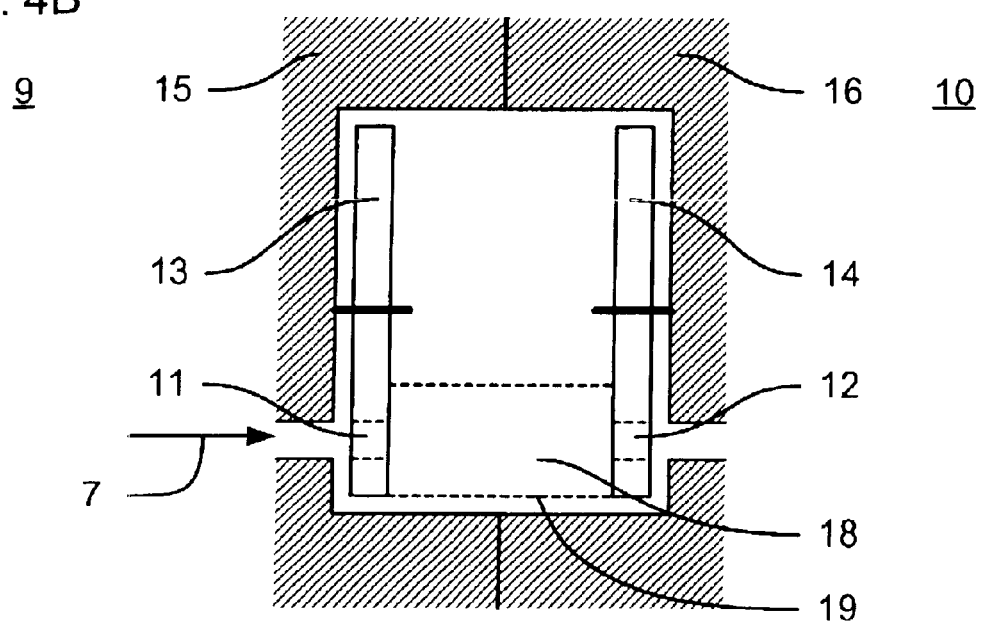

FIG. 4A shows part of an alternative configuration of a chopper of the present invention. In this case two rotating plates 13, 14 are disposed between two stationary plates (not shown). Again, for the chopper to be open (namely providing an opening through a barrier separating two compartments of the apparatus), the openings in the stationary plates (which are aligned with the beam of radiation) must be aligned with the openings 11, 12 on the first and second rotating plates 13, 14. FIG. 4B shows, in cross section, the rotating plates 13 and 14 installed with stationary plates 15, 16.

The openings 11, 12 in the rotating plates 13, 14 need not have the same radius r11, r12. However, the openings 11, 12 are preferably the same distance r2 from the center of rotation of the plates 13, 14.

The rotating plates 13, 14 may be connected to each other to ensure that they rotate in unison, thus keeping the openings 11, 12 aligned. Alternatively the plates 13, 14 may be mounted such that they rotated at different speeds or, for example, in opposite directions. This requires greater precision as both plates 13, 14 must be correctly aligned with the openings in the stationary plates 15, 16 at the same time to allow the pulse of radiation 7 through the opening in the barrier. However, rotating the plates in opposite directions advantageously reduces the amount of time that the chopper is partially open.

The rotating plates 13, 14 are arranged a distance d from each other, creating a space 18 between them. This space 18 may be filled with a buffer gas which will further reduce the flow of gas from the first compartment 9 to the second compartment 10 through the chopper. This is beneficial as the gas in the first compartment 9 may have a detrimental effect on components of the apparatus in the second compartment 10. For example the Xenon in the source LA absorbs EUV radiation. It is therefore desirable to minimize the amount of Xenon in the remainder of the apparatus. The buffer gas is selected for its relatively low impact on the remainder of the system. It is therefore less desirable to prevent flow of the buffer gas into the second compartment than it is to prevent the gas in the first compartment from flowing into the second compartment. More information on such buffer gasses may be found in U.S. Patent Application Publication 2003/0142280 A1 which is incorporated herein by reference. Argon, for example, may be used as the buffer gas.

In order to reduce the volume between the two plates 13, 14 that must be filled with buffer gas, a tube 19 (shown in dotted lines in FIG. 4B) may be inserted between the rotating plates 13, 14. The tube 19 may, if both plates 13, 14 rotate in unison, be attached to both rotating plates 13, 14. Alternatively, for example, if the rotating plates 13, 14 rotate in opposite directions, the tube 19 may be attached to only one of the rotating plates 13, 14 or may be attached to neither of the rotating plates 13, 14 but be in a fixed location with respect to the openings in the stationary plates 15, 16. Each end of the tube 19 surrounds the opening 11, 12 in the rotating plate 13, 14 and may be attached to the edges of the openings 11, 12. Where one of the openings is larger than the other (for example, as shown in FIG. 4A), the tube 19. may be frustro-conical in shape.

The buffer gas may be replenished by a permanent flow through the space 18 between the rotating plates 13, 14. Alternatively the buffer gas may be replenished periodically. The buffer gas may be pumped out of the space 18, periodically or continuously, or may disperse.

As an alternative, the space 18 between the rotating plates 13, 14 may be filled with a third stationary plate with openings aligned with those of the first two stationary plates.

FIGS. 5A to 5F show a chopper of the present invention which periodically replenishes the buffer gas in the space between two rotating plates. FIGS. 5B to 5F are cross-sections along the line A—A in FIG. 5A. The chopper includes two rotating plates 21, 22, each of which has an opening 23, 24, respectively. The rotating plates 21, 22 are arranged between two stationary plates 25, 26. A frustro-conical surface 30 is provided between the openings 23, 24 in the rotating plates 21, 22. The surface 30 defines a space 31 that may be flushed with buffer gas.

Figure 5A:
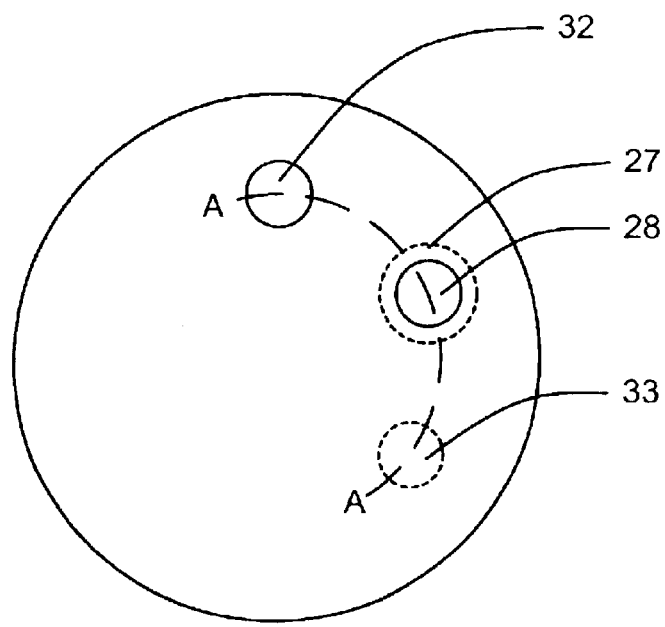
FIGS. 5A through 5F depict a controlled aperture of the present invention at five instants through its cycle.
Figure 5B:
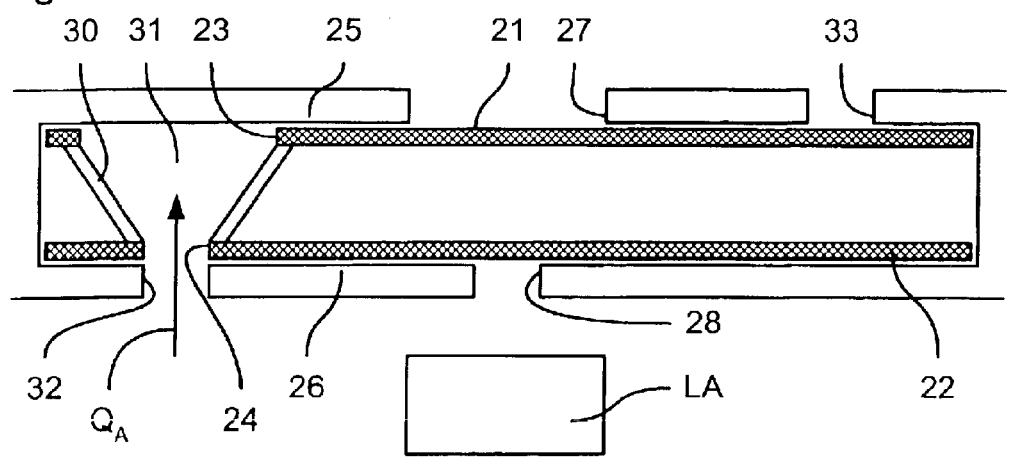

At the instant shown in FIG. 5A the opening 24 in the first rotating plate 22 is aligned with a buffer inlet opening 32 in the first stationary plate 26. At this instant the pressure in the space 31 is lower than that in the buffer supply, resulting in a flow $Q_A$ of buffer gas into the space 31. As the rotating plates 21, 22, with the surface 30 attached between them, rotate, the opening 24 in the first rotating plate moves out of alignment with the buffer inlet opening 32 in the first stationary plate 26.

Figure 5C:
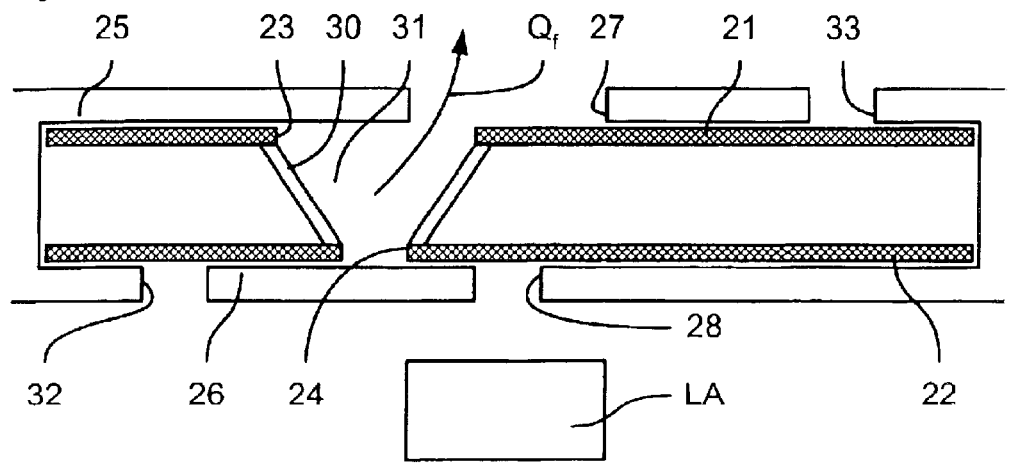

At the instant shown in FIG. 5C the opening 24 in the first rotating plate 22 is no longer aligned at all with the buffer gas inlet opening 32 in the first stationary plate 26. The opening 23 in the second rotating plate 21 is, however, partially aligned with the radiation beam opening 27 in the second stationary plate 25. This results in some leakage $Q_F$ of the buffer gas from the space 31 into the second compartment 10 of the apparatus.

Figure 5D:
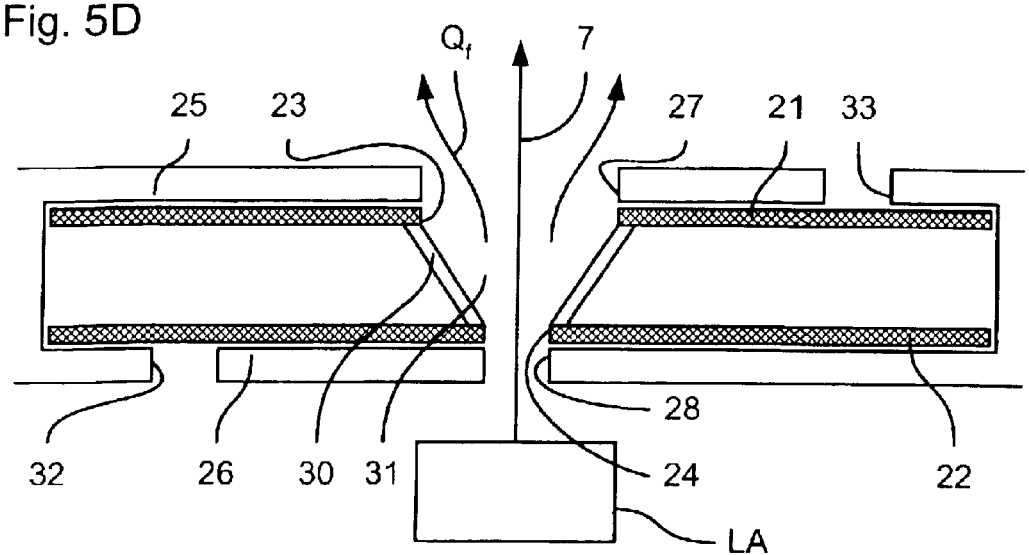

At the instant shown in FIG. 5D the opening 24 in the first rotating plate 22 is aligned with the radiation beam opening 28 in the first stationary plate 26 and the opening 23 in the second rotating plate 21 is fully aligned with the radiation beam opening 27 in the second stationary plate 25. The chopper is therefore open, enabling a pulse of radiation 7 to be radiated from the source LA in the first compartment 9 to the second compartment 10. Further leakage $Q_F$ of the buffer gas into the second compartment 10 occurs at this stage. However, provided that the opening is only open for a short duration, a significant amount of gas from the first compartment 9 will not leak through into the second compartment 10 and the majority of the gas that does leak into the second compartment 10 is merely the buffer gas.

Figure 5E:
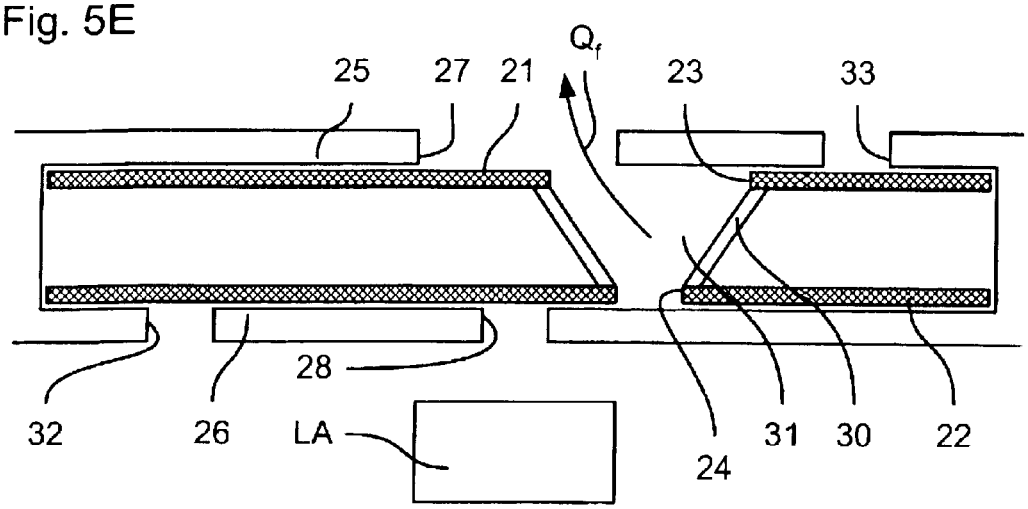
Figure 5F:
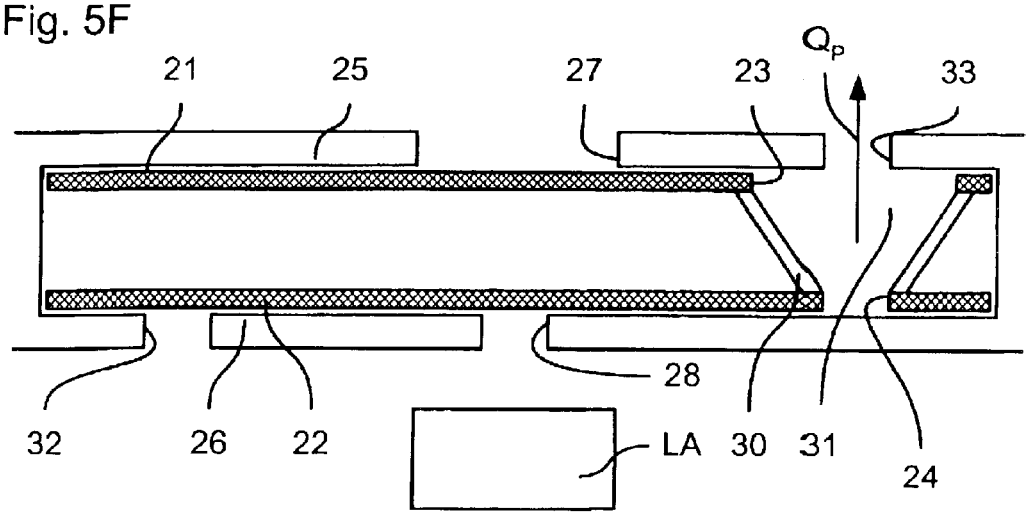

At the instant shown in FIG. 5E the opening 24 in the first rotating plate 22 is no longer aligned with the radiation beam opening 28 in the first stationary plate 26. The opening 23 in the second rotating plate 21 is however partially aligned with the radiation beam opening 27 in the second stationary plate 25 resulting in some further leakage $Q_F$ of the buffer gas into the second compartment 10.

At the instant shown in FIG. 5G the opening 23 in the second rotating plate 21 is aligned with a buffer exhaust opening 33 in the second stationary plate 25. This is connected to a relatively large volume, maintained at a low pressure, and consequently the remaining buffer gas in space 31 is exhausted in a flow $Q_P$ through the opening.

For the chopper shown in FIGS. 5A to 5G to operate effectively, the characteristic time taken for the buffer gas to flow from the space 31 into the second compartment 10 should be greater than the time for which the space 31 is (partially) open to the second compartment 10 (namely the instants shown in FIGS. 5C, 5D and 5E). The time for which the space 31 is open to the second compartment 10 can be reduced by moving the arrangement of the openings 32, 27, 28, 33 in the stationary plates 25, 26 (shown in FIG. 5A) closer together. The characteristic time for the buffer gas to empty from the space 31 may be increased by adding a gas flow restriction that is transparent to the radiation, such as a foil trap, on the side of the chopper to which the buffer gas flows.

As shown in FIGS. 5B to 5G the frustro-conical surface 30 is attached to the rotating plates 21, 22. However, this need not be the case and the surface may be fixed relative to the stationary plates, the opening in the rotating plates aligning with it when they are aligned with the openings in the stationary plates. In such a case the surface may need to be larger. Additionally the surface need not be frustro-conical in shape.

Figure 6A:
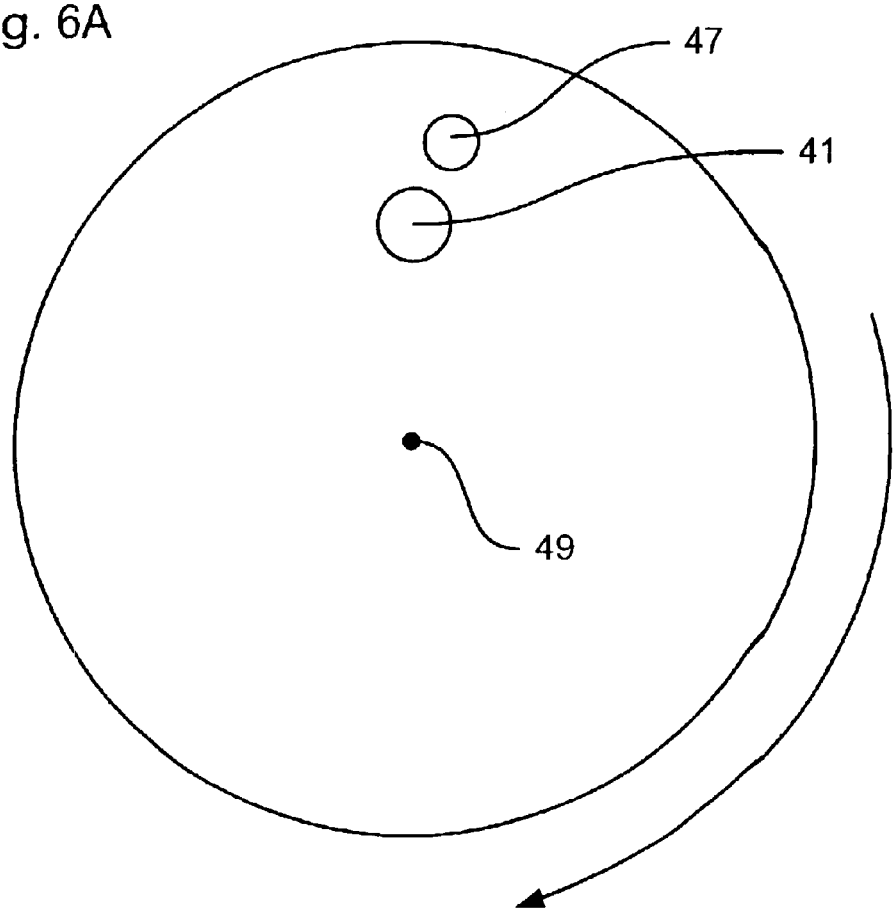
FIGS. 6A and 6B depict a further controlled aperture according to the present invention.
Figure 6B:
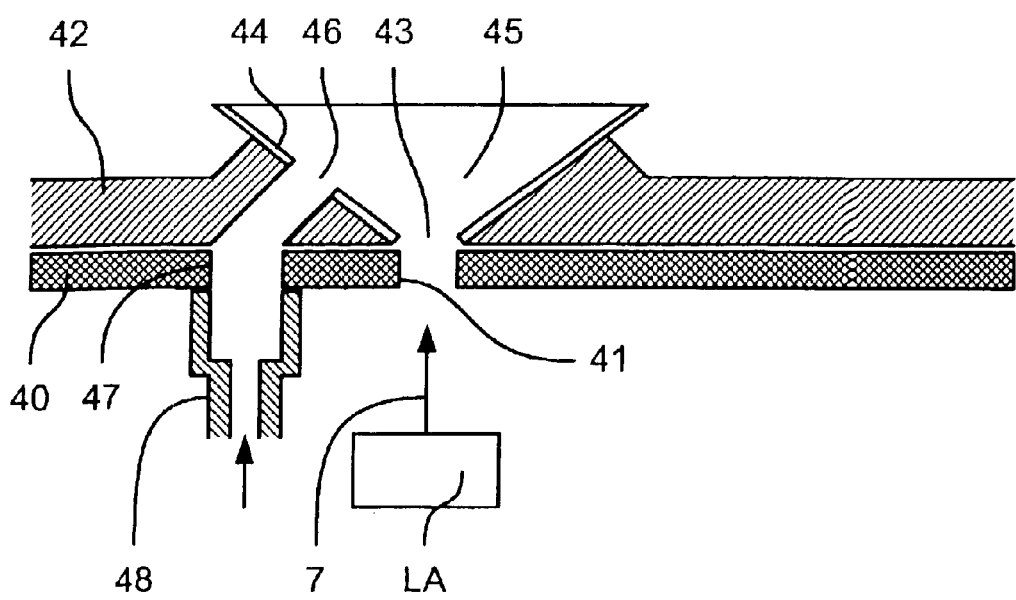

FIGS. 6A and 6B show, a further variant of a chopper suitable for use in the present invention. A rotating plate 40 is provided adjacent to a stationary plate 42. As the rotating plate 40 rotates, an opening 41 in it is periodically aligned with an opening 43 in the stationary plate 42, allowing a beam of radiation 7, from the source LA, to be radiated through the barrier. The stationary plate 42 is provided with a surface 44 that defines an interface space 45. The interface space 45 may be provided with a buffer gas to reduce leakage of gas from the first compartment 9 through the barrier. The surface 44 has an opening 46, that periodically becomes aligned with a second opening 47 in the rotating plate 40. This may be used to provide fresh buffer gas to the interface space 45. As the rotating plate 40 rotates the opening 47 in the rotating plate 40 aligns with a buffer gas supply opening 48, enabling buffer gas to flow through to the interface space 45.

As shown in FIG. 6A the radiation beam opening 41 and the buffer gas opening 47 are arranged on the rotating plate at different distances from its axis of rotation 49. This enables the buffer gas to be provided to the interface space 45 at substantially the same time as the radiation beam 7 is passing through the chopper. Alternatively, as shown in FIG. 6A, the buffer gas opening 47 may be arranged to supply buffer gas to the interface space 45 slightly before the radiation beam opening 41 on the rotating plate 40 aligns with the opening 43 on the stationary plate 42.

While specific embodiments of the invention have been described above, it will be appreciated that the invention may be practiced otherwise than as described. The description is not intended to limit the invention.

What is claimed is:

1. A lithographic projection apparatus, comprising:
   a radiation system constructed and arranged to provide a pulsed beam of radiation;
   a support structure constructed and arranged to support a patterning device, the patterning device constructed and arranged to pattern the pulsed beam according to a desired pattern;
   a substrate table constructed and arranged to hold a substrate;
   a projection system constructed and arranged to project the patterned beam onto a target portion of the substrate; and
   a barrier constructed and arranged to prevent at least one of gas and particle flow from a first part of the apparatus to a second part of the apparatus that is at a lower pressure than said first part, the barrier comprising:
   a controlled aperture constructed and arranged to permit passage of pulses of the beam of radiation through the barrier when the controlled aperture is open and to substantially prevent one of gas and particle flow from the first to the second part of the apparatus when the controlled aperture is closed; and
   a controller that operates the controlled aperture to open and close the controlled aperture in synchronism with the pulsed beam.

2. A lithographic projection apparatus according to claim 1, wherein the controlled aperture comprises:
   a first stationary member, integral with or connected to the barrier, provided with an opening aligned with the beam of radiation; and
   a first rotating member, at least a part of which is adjacent to the stationary member, wherein the rotating member has one or more openings arranged such that, as the member rotates, an opening in the rotating member is periodically aligned with the openings in the stationary member, providing an opening through the barrier; and, when said openings are not aligned, the rotating member substantially prevents gas flow through the barrier.

3. A lithographic projection apparatus according to claim 2, further comprising a second stationary member, arranged such that at least a part of the rotating member is located between the first and second stationary members, and the second stationary member is also provided with an opening aligned with said beam of radiation.

4. A lithographic projection apparatus according to claim 3, further comprising a second rotating member at least a part of which is located between the first and second stationary members, wherein the second rotating member has one or more openings arranged such that, as the second rotating member rotates, an opening in the second rotating member is periodically aligned with the openings in the stationary members, providing an opening through the barrier if, simultaneously, an opening in the first rotating member is aligned with the openings in the stationary members; and when no opening in the second rotating member is aligned with the openings in the stationary member, the second rotating member substantially prevents gas and particle flow through the barrier.

5. A lithographic projection apparatus according to claim 4, further comprising a space, containing a buffer gas, between the first and second rotating members.

6. A lithographic projection apparatus according to claim 5, further comprising:
   a buffer gas inlet constructed and arranged to supply buffer gas to the space between the first and second rotating members when an opening in one of the rotating members is aligned with the inlet; and
   a buffer gas exhaust constructed and arranged to exhaust the buffer gas from the space when an opening in one of the rotating members is aligned with the exhaust.

7. A lithographic projection apparatus according to claim 5, further comprising a tube that, at least when the controlled aperture is open, extends from an edge surrounding an opening on the first rotating member to an edge surrounding an opening on the second rotating member; and wherein the tube limits the space.

8. A lithographic projection apparatus according to claim 7, wherein the opening surrounded by the tube on the first rotating member is larger than the opening surrounded by the tube on the second rotating member and the tube is frustro-conical in shape.

9. A lithographic projection apparatus according to claim 7, wherein the tube is fixed in a position aligned with the openings on the stationary members.

10. A lithographic projection apparatus according to claim 7, wherein the first and second rotating members rotate in unison and the tube is attached to the rotating members.

11. A lithographic projection apparatus according to claim 4, further comprising a third stationary member, at least a part of which is located between the first and second rotating members; the third stationary member also provided with an opening aligned with the beam of radiation.

12. A lithographic projection apparatus according to claim 4, wherein the first and second rotating members rotate in opposite directions.

13. A lithographic projection apparatus according to claim 2, wherein the first stationary member further comprises:
   a tube, extending from an edge surrounding the opening in the first stationary member, constructed and arranged to define a space that opens into the second part of the apparatus; and
   a buffer gas inlet constructed and arranged to supply buffer gas to the space when an opening in the first rotating member is aligned with the inlet.

14. A lithographic projection apparatus according to claim 1, wherein the radiation system comprises a radiation source which is in the first part of the apparatus; and the second part of the apparatus is a substantially evacuated system.

15. A lithographic projection apparatus according to claim 1, wherein the substrate table is in the first part of the apparatus and the second part of the apparatus is the projection system.

16. A lithographic projection apparatus according to claim 1, wherein the controller is suitable for closing the controlled aperture so as to block at least one pulse of the beam of radiation.

17. A lithographic projection apparatus according to claim 1, wherein the controlled aperture comprises at least one of a low-emissivity coating on a substrate facing side and an infrared reflective coating on another side.

18. A device manufacturing method for use with a lithographic projection apparatus, the method comprising:
   providing a pulsed beam of radiation using a radiation system of the lithographic projection apparatus, the radiation system including a radiation source;
   using a patterning device to endow the pulsed beam with a pattern in its cross-section;
   projecting the patterned beam of radiation onto a target portion of a layer of radiation-sensitive material at least partially covering a substrate using a projection system of the lithographic projection apparatus;
   opening and closing, in synchronism with the pulsed beam, a controlled aperture in a barrier for preventing gas and particle flow from a first part to a second part of the lithographic projection apparatus wherein the first part includes the radiation source and the second part includes a remainder of the lithographic projection apparatus;
   the controlled aperture providing an opening through the barrier aligned with one of the beams of radiation during pulses of the pulsed beam and substantially preventing at least one of gas flow and particle flow from the first part to second part of the lithographic projection apparatus between the pulses.

19. A method according to claim 18, wherein the first part includes the radiation source and the second part includes a remainder of the lithographic projection apparatus.

20. A method according to claim 18, wherein the first part includes the substrate and the second part includes the projection system.

21. A lithographic projection apparatus, comprising:
   a radiation system constructed and arranged to provide a pulsed beam of radiation;
   a support structure constructed and arranged to support a patterning device, the patterning device constructed and arranged to pattern the pulsed beam according to a desired pattern;
   a substrate table constructed and arranged to hold a substrate;
   a projection system constructed and arranged to project the patterned beam onto a target portion of the substrate; and
   a barrier constructed and arranged to prevent at least one of gas and particle flow from a first part to a second part of the apparatus, the barrier comprising:
      a controlled aperture constructed and arranged to permit passage of pulses of the beam of radiation through the barrier when the controlled aperture is open and to substantially prevent one of gas and particle flow from the first to the second part of the apparatus when the controlled aperture is closed; and a controller that opens and closes operates the controlled aperture, to open and close the controlled aperture in synchronism with the pulsed beam so as to permit passage of pulses of the beam of radiation through the barrier, wherein the radiation system is contained within a first compartment, a remainder of the apparatus is provided in a second compartment; and the barrier is between the first compartment and the second compartment.

22. A lithographic projection apparatus according to claim 21, wherein the controlled aperture comprises:

a first stationary member, integral with or connected to the barrier, provided with an opening aligned with the beam of radiation; and a first rotating member, at least a part of which is adjacent to the first stationary member, wherein the first rotating member has one or more openings arranged such that, as the first rotating member rotates, an opening in the first rotating member is periodically aligned with the opening in the first stationary member, providing an opening through the barrier and, when the openings are not aligned, the first rotating member substantially prevents gas and particle flow through the barrier.

23. A lithographic projection apparatus according to claim 22, further comprising a second stationary member, arranged such that at least a part of the first rotating member is located between the first and second stationary members; and the second stationary member is also provided with an opening aligned with the beam of radiation.

24. A lithographic projection apparatus according to claim 23, further comprising a second rotating member at least a part of which is located between the first and second stationary members, wherein the second rotating member has one or more openings arranged such that, as the second rotating member rotates, an opening in the second rotating member is periodically aligned with the openings in the stationary members, providing an opening through the barrier if, simultaneously, an opening in the first rotating member is aligned with the openings in the stationary members; and when no opening in the second rotating member is aligned with the openings in the stationary members, the second rotating member substantially prevents gas and particle flow through the barrier.

* * * * *